United States Patent
Chun

(10) Patent No.: US 9,997,223 B2
(45) Date of Patent: Jun. 12, 2018

(54) SEMICONDUCTOR DEVICE INCLUDING METAL-OXIDE-SEMICONDUCTOR DISPOSED IN A COLUMN DECODER REGION

(71) Applicant: SK hynix Inc., Incheon-si, Gyeonggi-do (KR)

(72) Inventor: Duk Su Chun, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/485,660

(22) Filed: Apr. 12, 2017

(65) Prior Publication Data

US 2018/0025762 A1    Jan. 25, 2018

(30) Foreign Application Priority Data

Jul. 22, 2016  (KR) .......................... 10-2016-0093673

(51) Int. Cl.
    *G11C 7/00*    (2006.01)
    *G11C 8/10*    (2006.01)
    *G11C 8/08*    (2006.01)

(52) U.S. Cl.
    CPC . *G11C 8/10* (2013.01); *G11C 8/08* (2013.01)

(58) Field of Classification Search
    CPC ...................................................... G11C 16/30

USPC .............................................. 365/226, 230.06
    See application file for complete search history.

(56) References Cited

U.S. PATENT DOCUMENTS

| | | | |
|---|---|---|---|
| 2005/0135137 A1 | 6/2005 | Lee et al. | |
| 2010/0290267 A1* | 11/2010 | Miyo | ..................... G11O 5/145 365/149 |
| 2011/0205820 A1* | 8/2011 | Takayama | ........... G11C 11/4091 365/200 |
| 2013/0272056 A1 | 10/2013 | Liaw | |
| 2015/0001604 A1 | 1/2015 | Kim | |

FOREIGN PATENT DOCUMENTS

| | | |
|---|---|---|
| KR | 100541818 B1 | 1/2006 |
| KR | 101453157 B1 | 10/2014 |
| KR | 1020150003477 A | 1/2015 |

* cited by examiner

*Primary Examiner* — Hoai V Ho
(74) *Attorney, Agent, or Firm* — William Park & Associates Ltd.

(57) ABSTRACT

A semiconductor device may be provided. The semiconductor device may include a first power line located in a memory cell array region. The semiconductor device may include a second power line located in a column decoder region. The semiconductor device may include a third power line formed in a layer different from the first power line and the second power line, configured to couple the first power line to the second power line. The semiconductor device may include a metal-oxide-semiconductor (MOS) capacitor located below the third power line.

19 Claims, 4 Drawing Sheets

SEMICONDUCTOR DEVICE INCLUDING METAL-OXIDE-SEMICONDUCTOR DISPOSED IN A COLUMN DECODER REGION

CROSS-REFERENCE TO RELATED APPLICATION

The priority of Korean patent application No. 10-2016-0093673 filed on 22 Jul. 2016, the disclosure of which is hereby incorporated in its entirety by reference, is claimed.

BACKGROUND

1. Technical Field

Embodiments of the present disclosure may generally relate to a semiconductor device, and more particularly to a semiconductor device regarding a column decoder.

2. Related Art

With rapid development of higher-performance electronic systems (e.g., personal computers (PCs) or electronic communication systems), semiconductor devices acting as memories mounted to the electronic systems have been developed to implement products having higher speeds and higher degrees of integration.

In order to implement semiconductor devices having higher degrees of integration, a function for efficiently arranging memory cells of a memory cell region within a limited region is of importance. However, another function related to efficiently arranging a peripheral circuit region (hereinafter referred to as a peripheral region) that is needed to operate memory cells is more important than the function related to efficiently arranging memory cells of a memory cell region.

Typically, decoupling capacitors to filter noise generated between the operating supply devices (e.g., a power-supply device and a ground device) have been widely used in a peripheral region contained within a chip.

As the driving speeds of a semiconductor device are rapidly increased and reactance (L component) generated in a printed circuit board (PCB) is also increased, capacitance of the decoupling capacitor needs to be gradually increased. However, in recent times, the overall region of the chip is gradually reduced in size, such that technology for implementing large-capacity capacitors within a limited region has led to substantial difficulties with regards to the actual implementation.

Therefore, there is a need to research and develop a decoupling improvement solution capable of implementing higher capacitance within a limited region to remove power noise.

SUMMARY

In accordance with an aspect of the present disclosure, a semiconductor device may be provided. The semiconductor device may include a first power line located in a memory cell array region. The semiconductor device may include a second power line located in a column decoder region. The semiconductor device may include a third power line formed in a layer different from the first power line and the second power line, configured to couple the first power line to the second power line. The semiconductor device may include a metal-oxide-semiconductor (MOS) capacitor located below the third power line.

In accordance with an aspect of the present disclosure, a semiconductor device may include a plurality of power lines located in a memory cell array region. The semiconductor device may include a plurality of signal lines located in the memory cell array region. The semiconductor device may include a plurality of drivers located in a column decoder region. The semiconductor device may include MOS capacitors located in the column decoder region, and arranged to correspond to the plurality of power lines.

DETAILED DESCRIPTION

Various embodiments of the present disclosure may be directed to providing a semiconductor device including a column decoder that substantially obviates one or more problems due to limitations and disadvantages of the related art.

An embodiment of the present disclosure may relate to a new decoupling capacitance arrangement structure capable of further stabilizing power used in a column decoder of a semiconductor device.

An embodiment of the present disclosure may relate to a new power line structure capable of strengthening the main power used in a column decoder of a semiconductor device.

An embodiment of the present disclosure may relate to a new power line arrangement structure for a power mesh.

It is to be understood that both the foregoing general description and the following detailed description of embodiments are examples and are for explanation purposes.

Reference will now be made to certain embodiments, examples of which are illustrated in the accompanying drawings. Wherever possible, the same reference numbers will be used throughout the drawings to refer to the same or like parts. In the following description, a description of related known configurations or functions incorporated herein will be omitted when it may make the subject matter less clear.

Figure 1:
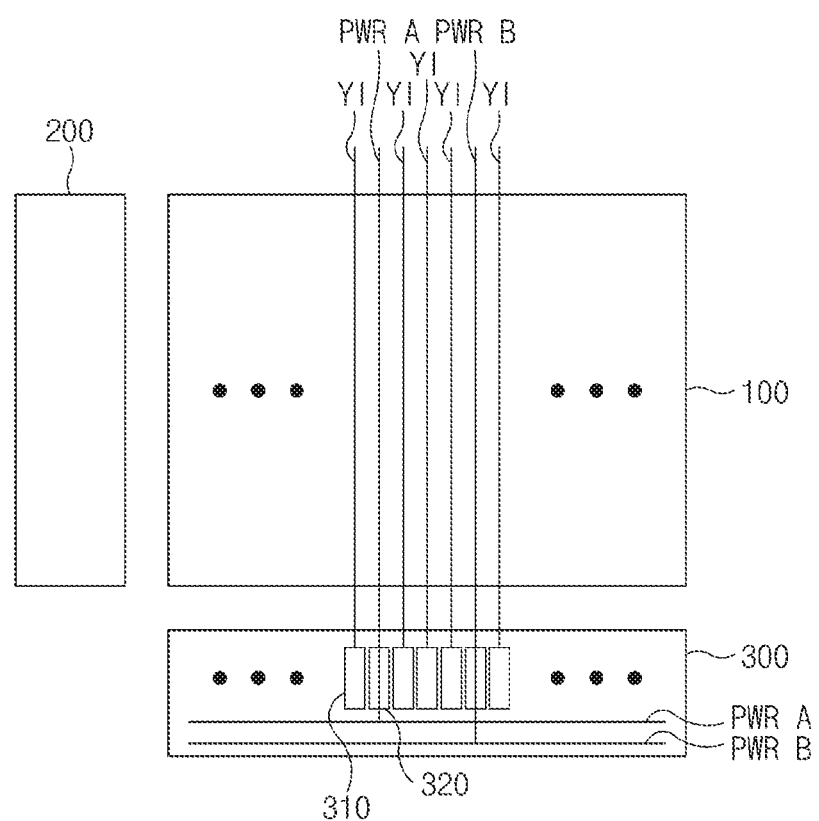
FIG. 1 is a schematic diagram illustrating a representation of an example of a semiconductor device according to an embodiment of the present disclosure.

FIG. 1 is a schematic diagram illustrating a representation of an example of a semiconductor device according to an embodiment of the present disclosure.

Referring to FIG. 1, the semiconductor device may include a memory cell array 100, a row decoder 200, and a column decoder 300.

Figure 3:
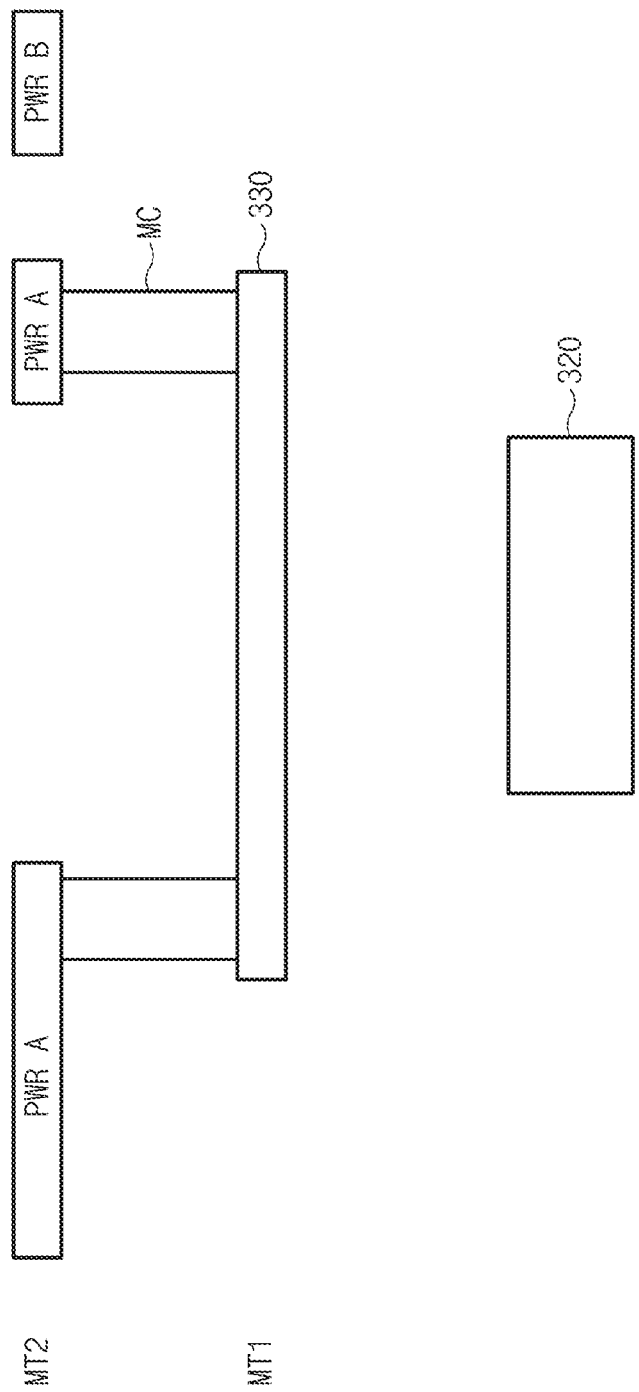
FIG. 3 is a cross-sectional view illustrating a representation of an example of the semiconductor device taken along the line A-A' of FIG. 2.

The memory cell array region 100 may include a plurality of word lines, a plurality of bit lines and a plurality of memory cells implemented in a matrix shape coupled between the word lines and the bit lines to store data therein. Power lines (PWR A, PWR B) for power supply and a plurality of signal lines (YI) for carrying a column selection signal may extend in a column direction and may be configured in an array, such that the power lines (PWR A, PWR B) and the signal lines (YI) are arranged over the memory cell array region 100. In this case, the power lines (PWR A, PWR B) and the signal lines (YI) may be formed at a metal-2 layer (MT2), and the power lines (PWR A, PWR B) may be arranged one by one at intervals of the predetermined number of signal lines (YI) (for example, 3 signal lines as illustrated in FIG. 3).

A row decoder region 200 may be located at one side of the memory cell array region 100. The row decoder region 200 may include decoders to generate a word line selection signal (row address) selecting memory cells to be used for data read or data write, as well as to apply the word line selection signal (row address) to word lines.

The column decoder region 300 may be located at the other side of the memory cell array region 100, and may include drivers 310 to generate a column selection signal for selectively coupling a sense-amplifier (sense-amp) to data input/output (I/O) lines. Each driver 310 may include a plurality of transistors. Each driver 310 may be coupled to signal lines (YI) formed in the memory cell array region 100. The power lines (PWR A, PWR B) extended in a row direction may be arranged over the column decoder region 300 (e.g., the metal-2 (MT2) layer). The power lines (PWR A, PWR B) arranged in the metal-2 (MT2) layer in the column decoder region 300 and the power lines (PWR A, PWR B) arranged in the metal-2 (MT2) layer in the memory cell array region 100 may be coupled to each other through a metal line of another layer (e.g., metal-1 (MT1) layer). MOS capacitors 320 may be formed below the metal line for coupling the power lines (PWR A, PWR B) of the memory cell array region 100 to the power lines (PWR A, PWR B) of the column decoder region 300. The drivers 310 and the MOS capacitors 320 may be arranged in an array. For example, the respective transistors constructing the MOS capacitors 320 may have the same size (the same width and length) as the other transistors constructing the decoders 310. The transistors constructing the MOS capacitors 320 and the other transistors constructing the decoders 310 may be formed through the same process.

Figure 2:
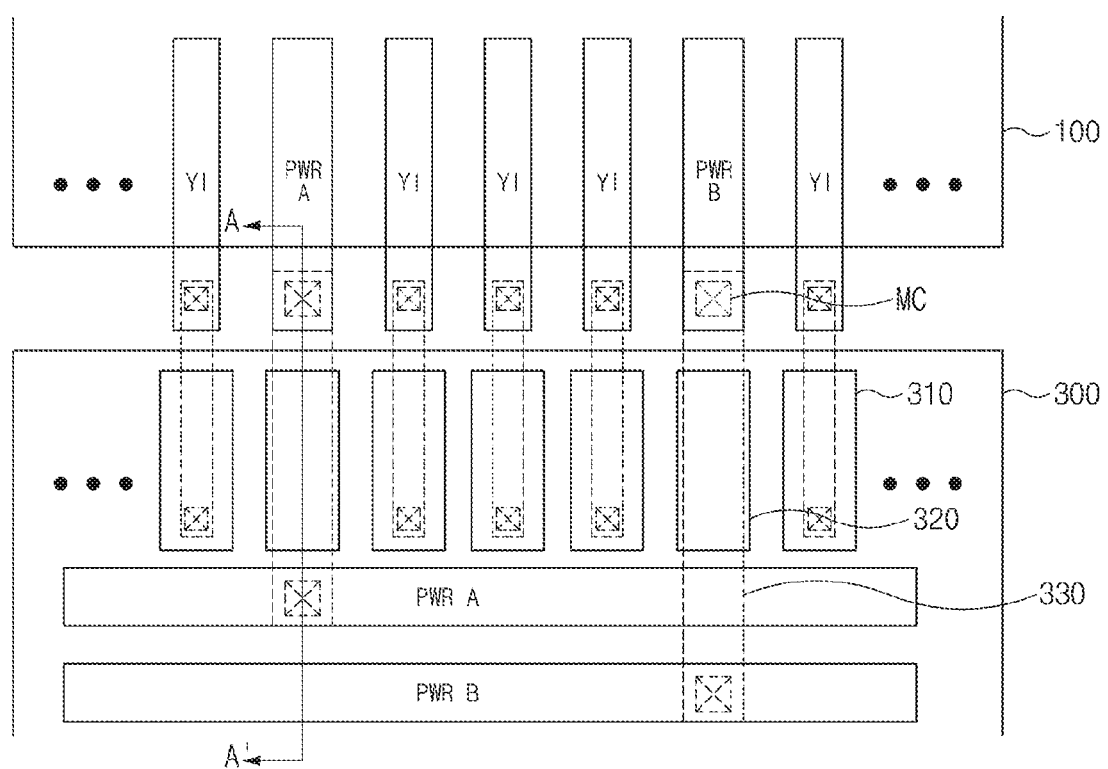
FIG. 2 is a plan view illustrating a representation of an example of an arrangement relationship of power lines and metal-oxide-semiconductor (MOS) capacitors illustrated in FIG. 1.

FIG. 2 is a plan view illustrating a representation of an example of an arrangement relationship of power lines and metal-oxide-semiconductor (MOS) capacitors illustrated in FIG. 1. FIG. 3 is a cross-sectional view illustrating a representation of an example of the semiconductor device taken along the line A-A' of FIG. 2.

Power lines (PWR A, PWR B) and signal lines (YI), which are extended in a column direction and arranged in an array, may be formed in the metal-2 (MT2) layer formed over the memory cell array region 100. In this case, the power lines (PWR A, PWR B) may be arranged one by one at intervals of 3 signal lines (YI).

Drivers for generating a column selection signal driving the sense-amplifier may be arranged in the column decoder region 300 located at one side of the memory cell array region 100 may be arranged in an array according to the signal lines (YI). The power lines (PWR A, PWR B) arranged in a row direction may be disposed in the column decoder region 300. The power lines (PWR A, PWR B) formed over the column decoder region 300 may also be formed in the metal-2 (MT2) layer in the same manner as in the other power lines (PWR A, PWR B) of the memory cell array region 100.

The power lines (PWR A, PWR B) of the memory cell array region 100 and the power lines (PWR A, PWR B) of the column decoder region 300 in the metal-2 (MT2) layer may be coupled to the metal line 330 of the metal-1 (MT1) layer acting as a lower layer through a metal contact (MC). That is, the metal line 330 of the metal-1 (MT1) layer may be used as a power line for coupling the power lines (PWR A, PWR B) of the memory cell array region 100 to the power lines (PWR A, PWR B) of the column decoder region 300.

The conventional power lines formed in the metal-2 (MT2) layer are coupled to the metal lines of a metal-3 (MT3) layer acting as an upper layer of the metal-2 (MT2) layer, and may receive a power-supply voltage from the metal-3 (MT3) layer (not illustrated). That is, the conventional power lines of the memory cell array region 100 and the column decoder region 300 are designed to receive a power-supply voltage by connection to the power lines formed in the metal-3 (MT3) layer and are not coupled to each other through the metal-1 layer (MT1). However, the power lines (PWR A, PWR B) of the memory cell array region 100 formed in the metal-2 (MT2) layer and the power lines (PWR A, PWR B) of the column decoder region 300 in the metal-2 (MT2) layer may be coupled to each other through the metal line 330 of the metal-1 (MT1) layer.

MOS capacitors 320 for interconnecting a source terminal and a drain terminal of each transistor may be formed below the metal line 330 for coupling the power lines (PWR A, PWR B) of the memory cell array region 100 to the power lines (PWR A, PWR B) of the column decoder region 300. That is, MOS capacitors 320 may be formed among three drivers 310 in the column decoder region, and the drivers 310 and the MOS capacitors 320 may be arranged in an array.

For example, transistors constructing the MOS capacitors 320 may have the same size (the same width and length) as in the transistors constructing the drivers 310. Moreover, the transistors constructing the MOS capacitors 320 and the transistors constructing the drivers 310 may be simultaneously formed through the same process.

Although the above-mentioned embodiments have, for example, disclosed that 3 signal lines (YI) are disposed among the power lines (PWR A, PWR B) formed in the memory cell array region for convenience of description, the scope or spirit of the present disclosure is not limited thereto.

As is apparent from the above description, the embodiments of the present disclosure can stabilize power used in a column decoder of the semiconductor device such that drivers may be more stably driven.

In addition, the embodiments of the present disclosure may more efficiently strengthen power used in the column decoder of the semiconductor device.

Figure 4:
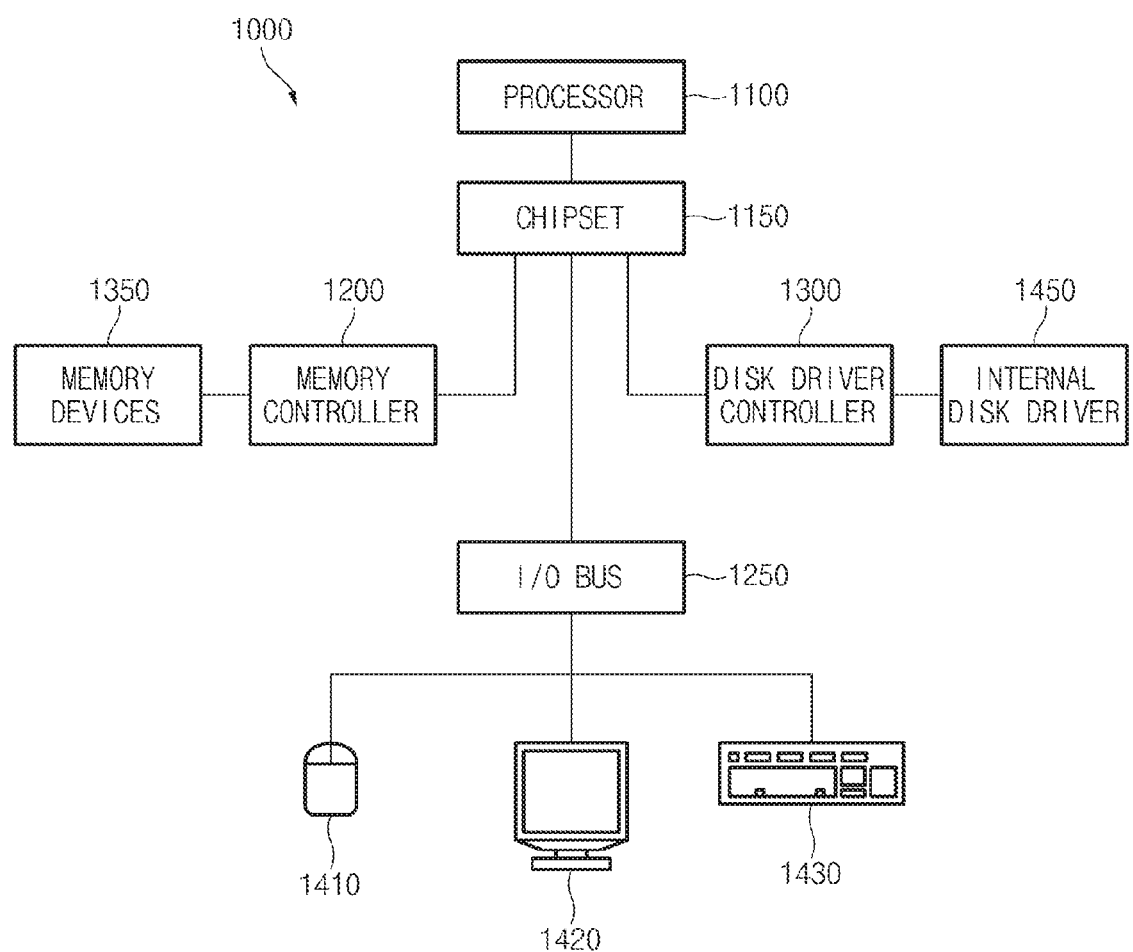
FIG. 4 illustrates a block diagram of an example of a representation of a system employing a semiconductor device with the various embodiments discussed above with relation to FIGS. 1-3.

The semiconductor devices as discussed above (see FIGS. 1-3) are particular useful in the design of other memory devices, processors, and computer systems. For example, referring to FIG. 4, a block diagram of a system employing a semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device as discussed above with reference to FIGS. 1-3. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-3, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a semiconductor device as discussed above with relation to FIGS. 1-3. In alternate embodiments, such as, for example but not limited to, cellular phones or digital cameras, the components may differ from the embodiments illustrated in FIG. 4.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents are possible. The above embodiments are not limited by the type of deposition, etching polishing, and patterning steps described herein. Nor are the embodiments limited to any specific type of semiconductor device. For example, the present disclosure may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
    a first power line located in a memory cell array region, and extended in a first direction;
    a second power line located in a column decoder region, and extended in a second direction crossing the first direction;
    a third power line formed in a layer different from the first power line and the second power line, and configured to couple the first power line to the second power line; and
    a metal-oxide-semiconductor (MOS) capacitor located in the column decoder region, below the third power line.

2. The semiconductor device according to claim 1, wherein the third power line is located below the first power line and the second power line.

3. The semiconductor device according to claim 1, further comprising:
    a plurality of signal lines located in the memory cell array region, and arranged in an array in conjunction with the first power line.

4. The semiconductor device according to claim 3, wherein each of the plurality of signal lines extend in the first direction.

5. The semiconductor device according to claim 3, wherein two or more signal lines are located between neighboring power lines.

6. The semiconductor device according to claim 3, wherein the plurality of signal lines are located a layer formed over the memory cell array region, and the first power line are located at the same layer as the plurality of signal lines.

7. The semiconductor device according to claim 3, wherein the plurality of signal lines includes a metal line to carry a column selection signal(YI).

8. The semiconductor device according to claim 3, further comprising:
    a plurality of drivers located in the column decoder region, arranged to correspond to the signal lines, and arranged in an array in conjunction with the MOS capacitor.

9. The semiconductor device according to claim 8, wherein each transistor constructing the MOS capacitor has substantially the same size as in each transistor constructing each of the drivers.

10. The semiconductor device according to claim 9, wherein each of the transistors constructing the respective MOS capacitors and each of the transistors constructing the respective drivers are simultaneously formed by the same process.

11. The semiconductor device according to claim 8, wherein the drivers are configured to generate a column selection signal.

12. The semiconductor device according to claim 8, wherein each driver is respectively coupled to a corresponding signal line.

13. A semiconductor device comprising:
   a plurality of power lines located in a memory cell array region;
   a plurality of signal lines located in the memory cell array region, and arranged between the power lines;
   a plurality of drivers located in a column decoder region, and arranged to correspond to the plurality of signal lines; and
   metal-oxide-semiconductor (MOS) capacitors located in the column decoder region, and arranged to correspond to the plurality of power lines.

14. The semiconductor device according to claim 13, wherein the power lines are arranged in an array in conjunction with the signal lines, and are arranged one by one at intervals of a predetermined number of signal lines.

15. The semiconductor device according to claim 13, wherein one or more signal lines are located between each of the first power lines.

16. The semiconductor device according to claim 13, wherein the plurality of signal lines are located a layer formed over the memory cell array region, and the power lines are located at the same layer as the plurality of signal lines.

17. The semiconductor device according to claim 13, wherein the drivers and the MOS capacitors are arranged in an array.

18. The semiconductor device according to claim 13, wherein:
   each transistor constructing each of the MOS capacitors has the same size as in each transistor constructing each of the drivers.

19. The semiconductor device according to claim 18, wherein each of the transistors constructing each of the respective MOS capacitors and each of the transistors constructing each of the respective drivers are simultaneously formed by the same process.

* * * * *